United States Patent
Gerber et al.

(10) Patent No.: US 7,786,920 B2
(45) Date of Patent: Aug. 31, 2010

(54) METHOD AND DEVICE FOR CONTROLLING A SUCCESSIVE APPROXIMATION REGISTER ANALOG TO DIGITAL CONVERTER

(75) Inventors: Johannes Gerber, Unterschleissheim (DE); Bernhard Wolfgang Ruck, Freising (DE)

(73) Assignee: Texas Instruments Incorporated, Dallas, TX (US)

( * ) Notice: Subject to any disclaimer, the term of this patent is extended or adjusted under 35 U.S.C. 154(b) by 41 days.

(21) Appl. No.: 12/204,301

(22) Filed: Sep. 4, 2008

(65) Prior Publication Data
US 2009/0066556 A1 Mar. 12, 2009

Related U.S. Application Data

(60) Provisional application No. 61/016,937, filed on Dec. 27, 2007.

(30) Foreign Application Priority Data
Sep. 11, 2007 (DE) .................. 10 2007 043 145

(51) Int. Cl.
H03M 1/38 (2006.01)
(52) U.S. Cl. ...................... 341/161; 341/155
(58) Field of Classification Search ........... 341/161, 341/155, 120
See application file for complete search history.

(56) References Cited

U.S. PATENT DOCUMENTS

| 5,576,708 | A | 11/1996 | De Wit | |
|---|---|---|---|---|
| 6,433,727 | B1 | 8/2002 | Yoshinaga | |
| 6,538,594 | B1 | 3/2003 | Somayajula | |
| 6,909,392 | B2 * | 6/2005 | Fossum et al. | 341/162 |
| 7,015,841 | B2 * | 3/2006 | Yoshida et al. | 341/120 |
| 2004/0227654 | A1 * | 11/2004 | Yang | 341/172 |

FOREIGN PATENT DOCUMENTS

DE 699 30 201 T2 11/2006

OTHER PUBLICATIONS

Brian P. Ginsburg et al, "Dual Time-Interleaved Successive Approximation Register ADCs for an Ultra-Wideband Receiver," IEEE Journal of Solid-State Circuits, IEEE Service Center, Piscataway, NJ, US, vol. 42, No. 2, Feb. 1, 2007, pp. 247-257, XP011161670, ISSN: 0018-9200, p. 248, left-hand column, lines 1-30, figures, 1,7, relevant to Claims 1,4.

* cited by examiner

*Primary Examiner*—Brian Young
(74) *Attorney, Agent, or Firm*—Robert D. Marshall, Jr.; W. James Brady; Frederick J. Telecky, Jr.

(57) ABSTRACT

A method for controlling a successive approximation register analog to digital converter comprising connecting a first side of a capacitor to a first comparator input, during a sampling phase connecting the first side of a capacitor to an input and connecting a second side of the capacitor to a mid-voltage, following the sampling phase disconnecting the first side of the capacitor from the input and disconnecting the second side of the capacitor from the mid-voltage and autozeroing the comparator.

7 Claims, 2 Drawing Sheets

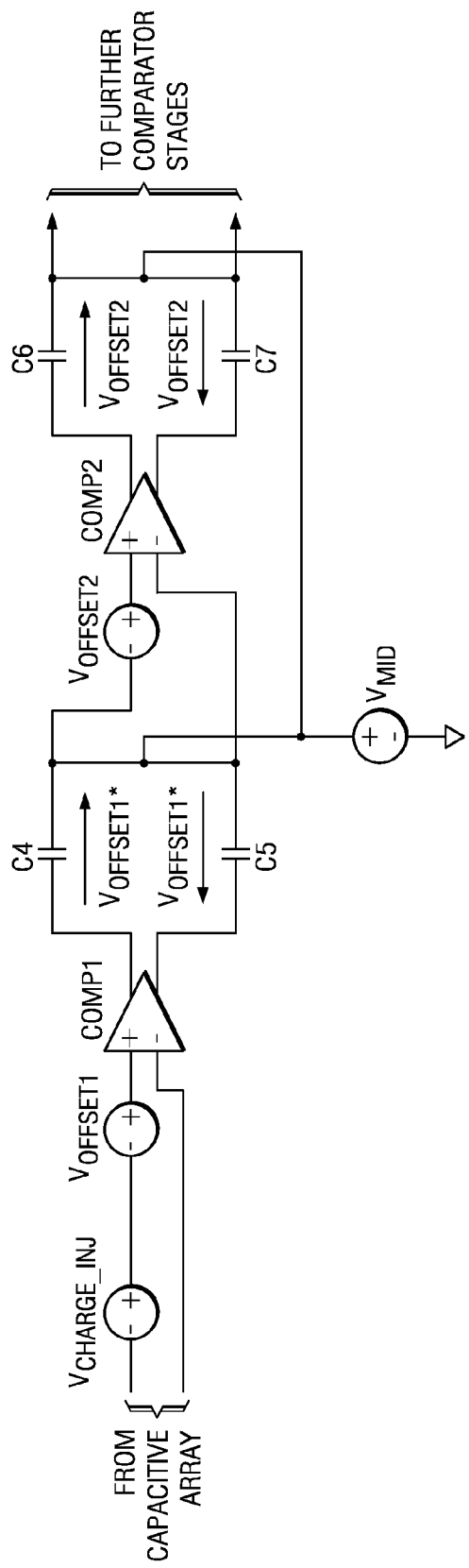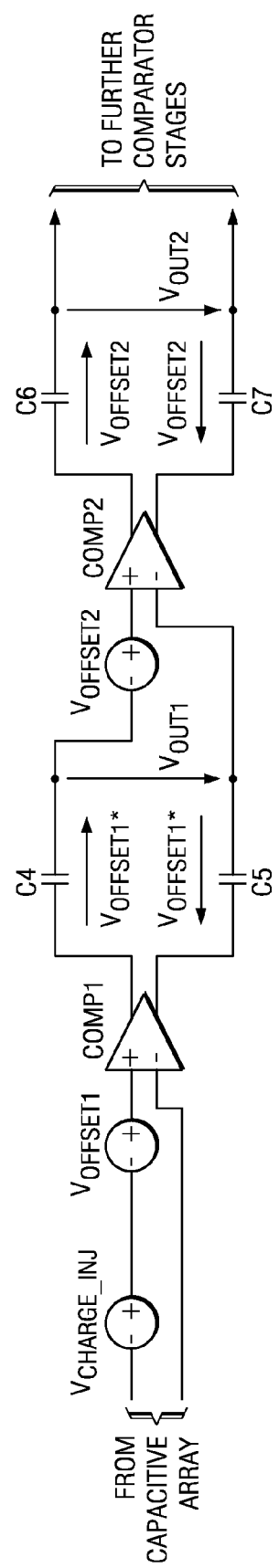
*FIG. 3*
*FIG. 4*

METHOD AND DEVICE FOR CONTROLLING A SUCCESSIVE APPROXIMATION REGISTER ANALOG TO DIGITAL CONVERTER

CLAIM OF PRIORITY

This application claims priority under 35 U.S.C. 119(a) to German Patent Application No. 10 2007 043 145.9 filed Sep. 11, 2007 and 35 U.S.C. 119(e)(1) to U.S. Provisional Application No. 61/016,937 filed Dec. 27, 2007.

TECHNICAL FIELD OF THE INVENTION

The present invention relates to successive approximation register analog to digital converters (SAR-ADCs), and more specifically to a method and device for controlling a SAR-ADC.

BACKGROUND OF THE INVENTION

SAR-ADCs are a specific type of ADC which typically use a capacitive array which stores a sample of an analog input voltage. One side of the capacitors in the capacitive array is coupled to an input voltage and the other to a reference voltage. This reference voltage is typically somewhere between two other reference voltages. This voltage is referred to as a mid-voltage although it is not necessarily in the exact middle of the supply voltage range or in the exact middle between the two other reference voltages, the supply voltage $V_{DD}$ and ground. After sampling the input voltage, switches open to store a charge on capacitors of the capacitive array. All capacitors of the array are coupled with one side to a common node, which is coupled to one input of a comparator. The other input of the comparator receives a comparator reference voltage. After initial sampling, the mid-voltage is also removed from the common input node. During conversion, the other side of each capacitor of the capacitive array is switched between two voltages. These two voltages are typically two reference voltages with the first reference voltage being ground and the second voltage being a specific voltage that allows the value of the input voltage to be determined step by step. In each step, a single capacitor of the array is switched from one reference voltage to another to redistribute the charge on the capacitors through the common node. The voltage on the common node changes accordingly and the comparator detects whether it is greater or smaller than the reference voltage. Thus the digital value representing the analog input voltage is determined step-by-step.

While the input nodes are connected to the mid-voltage during the sampling phase, the comparator undergoes autozeroing. Any offset introduced by the comparator is determined during this autozeroing and the AD-conversion phase uses a compensated comparator.

During the sampling steps when the mid-voltage is no longer applied and switches are open, additional undesired charge is injected from the switches into the input nodes of the comparator. To avoid this effect the input nodes, the switches and the capacitances are made strictly symmetric. This symmetric design insures charges caused by switching will only cause a common mode voltage. This voltage is suppressed by the common mode rejection ratio (CMRR) of the comparator. However, the CMRR is limited. Any unbalance between the input nodes, the capacitive loads or the switches may result in a differential voltage input voltage to the comparator. This can severely degrade the conversion results. SUMMARY OF THE INVENTION An object of the present invention is a method and a device to reduce effects due to charge injection during the adjusting step of a comparator in an SAR-ADC.

Accordingly the present invention is a method for controlling a successive approximation register analog to digital converter. In a sampling phase, a first switch connects one side of a capacitor with an input voltage. A second switch connects the other side of the capacitor to a mid-voltage. This second side of the capacitor is coupled to a first comparator input. The first switch and the second switch then open and the comparator performs autozeroing.

The first switch connects one side of a capacitor not connected to the comparator input or to the mid-voltage to an input voltage. The capacitor may be a capacitive array. The capacitor is connected to one input of a comparator such as the positive input. A second switch additionally connects the side of the capacitor that is connected to the comparator input to a mid-voltage. This mid-voltage may equal half the positive supply voltage ($V_{DD}/2$). During the sampling phase, the first and second switches are closed connecting the capacitor to both the input voltage and the mid-voltage. After sampling the input voltage, the first and second switches open disconnecting the input voltage and the mid-voltage from the capacitive array. The comparator performs autozeroing while the comparator's input nodes are decoupled from the mid-voltage. Consequently, the autozeroing considers the error charge injected into the capacitive array by the first and second switches and completely cancels the effect of this parasitic charge injection. This produces an offset-free transfer function in the analog to digital converter.

Preferably, the autozeroing samples an offset voltage at the first comparator input including the error charge injected into the capacitive array due to opening the first and second switches. This cancels the offset voltage at the first comparator input. Opening the first and second switches causes a charge injection offset voltage at the input of the comparator. This offset voltage is sampled using sampling circuitry inside the comparator, which can be a capacitor. In addition standard autozeroing circuitry can be used.

A third switch can be provided which is closed during the sampling phase. This third switch connects the second comparator input (for example the negative input) to the mid-voltage. Connecting both input nodes to the mid-voltage permits the offset of the comparator to be determined. If the charges injected by the second and third switches were equal, only common mode voltage would appear at the comparator's input nodes. However, any imbalance of the input nodes and the capacitances of the input nodes leads to differential voltages and therefore to incomplete offset cancellation. The present invention provides that the autozeroing includes the effects induced by opening the second and the third switches. Accordingly, the autozeroing is only carried out or continued until the first, second and third switch are all opened.

Ideally the method continues the autozeroing for a predetermined time after opening the first, second and third switches. The comparator and the autozeroing circuitry inside the comparator take some time to settle after the switches open. In other words, it takes some time for the autozeroing to cancel the effect of the parasitic charge injected when the switches open. The autozeroing should continue for the time it takes the comparator to settle. In this way, the comparator has time to fully cancel the effect of the parasitic charge injection and associated offset voltage. This can be implemented, for example, by changing the sequence clocking in the SAR state machine.

The present invention also provides an electronic device including a control circuit controlling a successive approximation register analog to digital converter. The control circuit comprises a comparator, a capacitive array having a capacitor with one side configured to be coupled to a first input of the comparator and switches. The control circuit closes a first switch connecting one side of the capacitor of the capacitive array to an input voltage, closes a second switch connecting the other side of the capacitor to a mid-voltage. The second input of the comparator can be switched to a mid-voltage by a third switch. The control circuit then performs autozeroing of the comparator only when the first and second switches open and, if there is a third switch, when the third switch opens. During the sampling phase of the input voltage onto the capacitive array, the inputs of the comparator are switched to the mid-voltage by closing the second and third switches. The comparator may already be set in an autozero mode. However, the comparator stays in autozeroing mode after the mid-voltage is disconnected from the capacitive array by opening the second switch. Any induced error charge will then be considered when autozeroing the comparator and will not interfere with the analog to digital conversion. The comparator in its autozero mode should have enough time to settle after the charge injections into the capacitive array due to opening of the first, second and third switches.

The present invention provides a SAR state machine, which performs a sequence of clocking an SAR capacitive digital to analog converter (CDAC, i.e. the capacitive array coupled to the input of the comparator) to provide sufficient delay between opening the switches coupling the inputs of a comparator to a mid-voltage and autozeroing of the comparator.

The electronic device comprises an autozeroing circuit configured to sample an offset voltage at an input of the comparator. The present invention aims to remove any offset voltage due to opening the switches, but the offset cancellation will include also the internal offset of the comparator. The effect of the offset voltage, caused by the parasitic charge injection upon opening of the switches, is then cancelled at the input of the comparator by the autozeroing circuit and does not affect the analog to digital conversion. The autozeroing circuit may include a chain of comparator stages. Each of the stages comprising a comparator having an input for receiving the offset voltage and an output connected to a sampling capacitor for sampling the offset voltage.

Advantageously, the device may further comprise a delay circuit to prolong the autozeroing for a predetermined time after the control circuitry has opened the first, second and/or third switches. After the switches open and inject a parasitic charge into the capacitive array, the comparator takes some time to settle during the autozeroing before it can fully cancel the effects of the error charge and associated offset voltage. Continuing the autozeroing for a time equal to the settling time of the comparator means that the comparator has enough time to settle and that the error charge will be fully offset. The delay circuit can be implemented in the sequence clocking in the SAR machine, which can be configured to prolong the autozeroing to be equal to the settling time of the comparator.

BRIEF DESCRIPTION OF THE DRAWINGS

These and other aspects of this invention are illustrated in the drawings, in which:

FIG. 3 is a simplified circuit diagram of autozeroing circuit for a successive approximation register analog to digital converter according to the invention during autozeroing; and FIG. 4 is a simplified circuit diagram of autozeroing circuit for a successive approximation register analog to digital converter according to the invention after autozeroing.

DETAILED DESCRIPTION OF PREFERRED EMBODIMENTS

Figure 1:
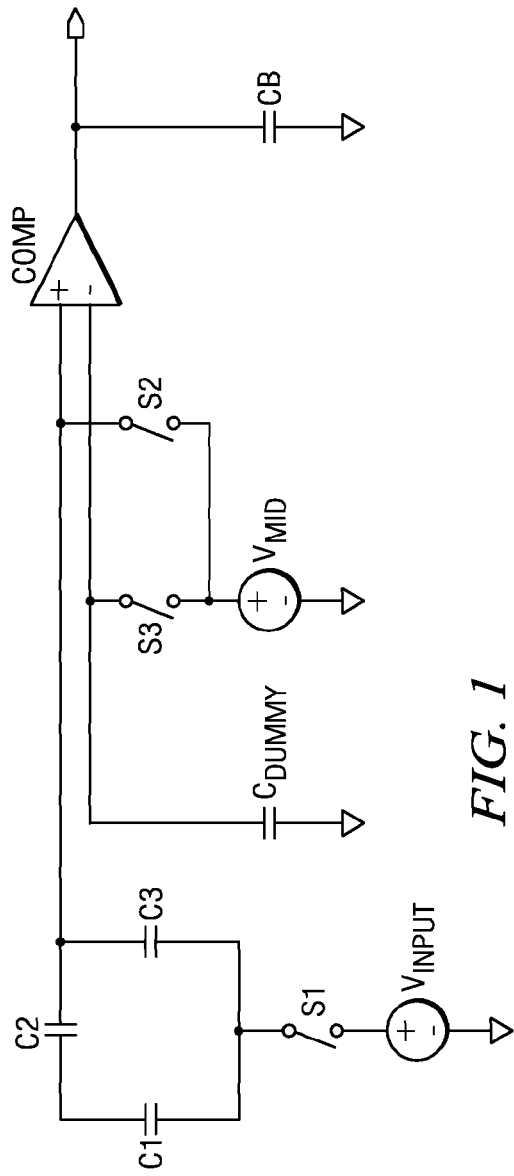
FIG. 1 is a simplified circuit diagram of a part of a circuit for a successive approximation register analog to digital converter according to the invention.

FIG. 1 shows a part of a successive approximation register (SAR) analog to digital converter (ADC). A capacitive array includes ring connected capacitors C1, C2 and C3. The ring connection includes: capacitor C1 connected with one side to C2 and the other side to C3; capacitor C2 connected with one side to C1 and the other side to C3; and capacitor C3 connected with one side to C1 and with the other side to C2. A node interconnecting capacitors C1 and C3 is connected via a switch S1 to a voltage input node $V_{INPUT}$. A node interconnecting capacitors C2 and C3 is connected directly to the positive input of a comparator COMP. This node is also connected via a switch S2 to a mid-voltage node $V_{MID}$. The mid-voltage $V_{MID}$ can be equal to half the positive supply voltage $V_{DD}/2$, for example. However, the exact value of the mid-voltage $V_{MID}$ is not decisive and may deviate substantially from half the positive supply voltage supply. The term "mid-voltage" is to be understood as a reference to any intermediate voltage appropriate for a specific architecture and implementation of the ADC. A dummy capacitor $C_{DUMMY}$ is connected between the negative input of comparator COMP and ground. The negative input of comparator COMP is also connected to the mid-voltage node $V_{MID}$ via switch S3. Dummy capacitor $C_{DUMMY}$ represents a capacitive load, which can be matched with the capacitive array connected to the other input node of the comparator. Matched values of $C_{DUMMY}$ and the capacitive array are useful as charge injections to both input nodes are then converted into similar voltages at the input nodes. Thus there is only a common mode voltage at the comparator input. The common mode voltage will be suppressed by the comparator's common mode rejection ratio (CMRR). In practice, the capacitive array consisting of capacitors C1 to C3 may include many more capacitors and switches. Typically there are sixteen or more capacitors for high resolution SAR-ADCs. The clocking and switching scheme for such a capacitive array is well known in the art. The capacitive array is often referred to as a capacitive digital to analog converter (CDAC). A buffering capacitor $C_B$ at the output of comparator COMP is connected between the output of comparator COMP and ground.

During the sampling phase, switch S1 is closed interconnecting capacitors C1 and C3 in the capacitive array to voltage input node $V_{INPUT}$. Thus the capacitive array is connected to the input voltage at the node $V_{INPUT}$. At the same time, switches S2 and S3 are closed connecting both the positive and negative input terminals of comparator COMP to mid-voltage $V_{MID}$. In the prior art, comparator COMP stays in an autozeroing mode only while the comparator's input nodes are connected to $V_{MID}$. When the sampling phase is finished, switches S2 and S3 open so that the mid-voltage $V_{MID}$ is disconnected from the capacitive array and from the input terminals of comparator COMP. The present invention provides that the comparator remains in the autozeroing mode for a certain time after these switches open. As switches S2 and S3 open a parasitic charge is injected into the capacitive array comprising capacitors C1, C2 and C3, and into dummy capacitor $C_{DUMMY}$. After this parasitic charge injection into capacitors C1, C2 and C3 and $C_{DUMMY}$, the input nodes of comparator COMP are floating which conserves the charge on these input nodes. The prior art treats the charge injection as the same on both input pins of comparator COMP under the assumption of ideal symmetry. If the voltage change at both inputs of comparator COMP is identical no error will result. However, in a real circuit there will always be an imbalance resulting in an offset voltage. In this invention, this induced error charge caused by the parasitic charge injection when switches S2 and S3 open is included in the autozeroing of the comparator. Thus this parasitic charge injection does not appear as an offset during analog to digital (AD) conversion. Following disconnection of mid-voltage node $V_{MID}$ from the capacitive array comprising capacitors C1, C2 and C3 by opening switch S2, comparator COMP stays in its autozeroing mode. This compensates for the voltage offset at the inputs of comparator COMP.

Figure 2:
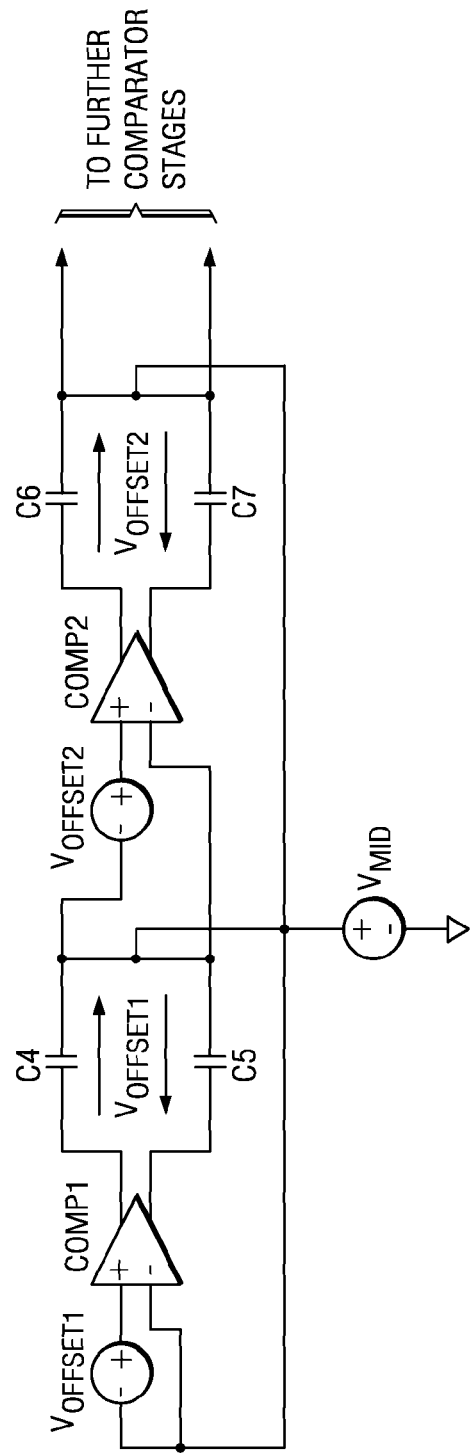
FIG. 2 is a simplified circuit diagram of autozeroing circuit for a successive approximation register analog to digital converter according to the invention during sampling of a single stage offset during autozeroing.

FIGS. 2 to 4 show autozeroing circuit in comparator COMP at different stages in autozeroing of comparator COMP. The autozeroing circuit comprises several comparator stages connected together in a chain. Only two are shown in FIGS. 2 to 4 for simplicity. First comparator COMP1 has its positive input connected to a node $V_{OFFSET1}$, which represents the voltage offset at the positive input of comparator COMP in FIG. 1. This is also the voltage offset at the positive input of first comparator COMP1 in the autozeroing circuit. The reason for a chain of comparators rather than a single comparator is that each comparator also acts as an amplifier. If the amplification or the gain in a comparator is too high, the output voltage saturates and it is impossible to compensate for the offset. The comparator or amplifier stage outputs are connected to capacitors C4 and C5 with capacitors C4 and C5 connected in parallel. The voltage $V_{OFFSET2}$ represents the offset voltage at the positive input of second comparator COMP2. This offset is represented by the second voltage source $V_{OFFSET2}$. Therefore $V_{OFFSET2}$ is connected to the positive input of second comparator COMP2 and the second side of capacitor C4. The second side of capacitor C5 is connected to the negative input of second comparator COMP2. The output stages of second comparator COMP2 are connected to capacitors C6 and C7. Further comparator stages, represented in FIGS. 2 to 4 by dotted lines, are connected to the other sides of capacitors C6 and C7.

FIG. 2 shows the sampling of a single stage offset autozeroing during the ADC sampling phase of the SAR-AD converter when the input voltage node $V_{INPUT}$ is connected to the capacitive array comprising capacitors C1, C2 and C3 as shown in FIG. 1. Initially, both the positive and the negative inputs of comparators COMP1 and COMP2 are shorted to the mid-voltage $V_{MID}$ and the offset voltage is sampled on the capacitors at each comparator stage output. The offset voltage $V_{OFFSET1}$ at the input of first comparator COMP1 is sampled on capacitors C4 and C5 and the offset voltage $V_{OFFSET2}$ at the input of second comparator COMP2 is sampled on capacitors C6 and C7. Thus the offset voltage of each stage is stored in its output capacitors.

FIG. 3 shows the situation when the capacitive array including capacitors C1, C2 and C3 is disconnected from the mid-voltage node $V_{MID}$ by opening the switches S2 and S3. As described above, when the switches S2 and S3 are opened a parasitic charge is injected into the capacitive array. This parasitic charge $V_{CHARGE\_INJ}$ is added on to the voltage offset $V_{OFFSET}$ at the positive input of first comparator COMP1 in the autozeroing circuit. Accordingly, the voltage offset at the positive input of first comparator COMP1 then increases to $V_{OFFSET1*}$, which is sampled on capacitors C4 and C5 at the output of comparator COMP1.

In FIG. 4, the autozeroing circuitry is shown in a state when autozeroing terminates after the capacitive array comprising capacitors C1, C2 and C3 has been disconnected from the mid-voltage node $V_{MID}$ by opening switches S2 and S3. Once autozeroing terminates, the voltage offset at the input of each comparator stage is stored on the capacitors at the output of each comparator stage. In the example shown here, the total voltage offset $V_{OFFSET1*}$ at first comparator COMP1 is stored on capacitors C4 and C5 and the voltage offset $V_{OFFSET2}$ at second comparator COMP2 is stored on capacitors C6 and C7. Because the voltage offset at each comparator stage is stored at the output of each stage, the voltage offset at the input of the comparator stages is cancelled. Accordingly, the output voltages $V_{OUT1}$ and $V_{OUT2}$ are practically zero. The offset compensation of the first comparator stage will also includes the effect of the offset voltage $V_{CHARGE\_INJ}$ caused by opening the switches S2 and S3. Thus the error charge induced at the input of comparator COMP will not appear as an offset during analog to digital conversion.

Autozeroing of comparator COMP should be given enough time to settle after the switches S2 and S3 open. The capacitive array is disconnected from the mid-voltage $V_{MID}$ and the charge injection happens before autozeroing terminates. Delay circuitry should then be provided, which prolongs autozeroing by a predetermined time. This time should be the time it takes for the comparator to settle and for the voltage offsets to be sampled on the capacitors in the autozeroing circuit. This can be achieved by adding an additional delay time, for example by changing the sequence clocking in the SAR state machine. Thereby, autozeroing is extended into the hold phase, which follows the sampling phase.

Although the present invention has been described with reference to a particular embodiment, it is not limited to this embodiment and no doubt further alternatives will occur to the skilled person that lie within the scope of the invention as claimed.

What is claimed is:

1. A method for controlling a successive approximation register analog to digital converter comprising:
   connecting a first side of a capacitor to a first comparator input;
   during a sampling phase connecting said first side of the capacitor to an input having an input voltage;
   during said sampling phase connecting a second side of said capacitor to a mid-voltage;
   following said sampling phase disconnecting said first side of said capacitor from said input having an input voltage;
   following said sampling phase disconnecting said second side of said capacitor from said mid-voltage; and
   autozeroing said comparator.

2. A method for controlling a successive approximation register analog to digital converter comprising:
   connecting a first side of a capacitor to a first comparator input;
   during a sampling phase connecting said first side of the capacitor to an input having an input voltage;
   during said sampling phase connecting a second side of said capacitor to a mid-voltage;
   following said sampling phase disconnecting said first side of said capacitor from said input having an input voltage;
   following said sampling phase disconnecting said second side of said capacitor from said mid-voltage; and
   autozeroing said comparator for a predetermined time after disconnecting said first side of said capacitor from said input having an input voltage and disconnecting said second side of said capacitor from said mid-voltage.

3. A method for controlling a successive approximation register analog to digital converter comprising:
connecting a first side of a capacitor to a first comparator input;
during a sampling phase connecting said first side of the capacitor to an input having an input voltage;
during said sampling phase connecting a second side of said capacitor to a mid-voltage;
during said sampling phase connecting a second input of said comparator to said mid-voltage;
following said sampling phase disconnecting said first side of said capacitor from said input having an input voltage;
following said sampling phase disconnecting said second side of said capacitor from said mid-voltage;
following said sampling phase disconnecting said second input of said comparator from said mid-voltage; and
autozeroing said comparator only after disconnecting said second input of said comparator from said mid-voltage.

4. An electronic device including a control circuit for controlling a successive approximation register analog to digital converter, the control circuit comprising:
a comparator having first and second inputs and an output;
a capacitive array having a capacitor with a first side connected to said first input of said comparator and a second side;
a first switch having a first side connected said second side of said capacitor and a second side connected to an input voltage;
a second switch having a first side connected to said first input of said comparator and a second side connected to a mid-voltage;
said control circuitry operable to
close said first switch during a sampling phase to connect said first side of said capacitor to said input voltage,
close said second switch during a sampling phase to connect said first input of said comparator to said mid-voltage,
open said first switch following said sampling phase,
open said second switch following said sampling phase, and
autozero said comparator following said sampling phase.

5. An electronic device including a control circuit for controlling a successive approximation register analog to digital converter, the control circuit comprising:
a comparator having first and second inputs and an output;
a capacitive array having a capacitor with a first side connected to said first input of said comparator and a second side;
a first switch having a first side connected said second side of said capacitor and a second side connected to an input voltage;
a second switch having a first side connected to said first input of said comparator and a second side connected to a mid-voltage;
an autozeroing circuit configured to sample an offset voltage at said first input of comparator created due to said opening of said first and second switches; and
said control circuitry operable to
close said first switch during a sampling phase to connect said first side of said capacitor to said input voltage,
close said second switch during a sampling phase to connect said first input of said comparator to said mid-voltage,
open said first switch following said sampling phase,
open said second switch following said sampling phase, and
autozero said comparator following said sampling phase.

6. The electronic device according to claim 5, wherein:
said autozeroing circuit includes a chain of comparator stages, each comparator stage including a comparator having an input receiving an offset voltage and an output connected to a sampling capacitor storing the offset voltage.

7. An electronic device including a control circuit for controlling a successive approximation register analog to digital converter, the control circuit comprising:
a comparator having first and second inputs and an output;
a capacitive array having a capacitor with a first side connected to said first input of said comparator and a second side;
a first switch having a first side connected said second side of said capacitor and a second side connected to an input voltage;
a second switch having a first side connected to said first input of said comparator and a second side connected to a mid-voltage;
said control circuitry operable to
close said first switch during a sampling phase to connect said first side of said capacitor to said input voltage,
close said second switch during a sampling phase to connect said first input of said comparator to said mid-voltage,
open said first switch following said sampling phase,
open said second switch following said sampling phase, and
autozero said comparator following said sampling phase; and
a delay circuit prolonging the autozeroing for a predetermined time after said control circuitry opens said first and second switches.

* * * * *